United States Patent [19]
Kettler

[11] Patent Number: 5,241,740
[45] Date of Patent: Sep. 7, 1993

[54] AUTOMATED EXCISE-FORM AND SHUTTLE SYSTEM AND APPARATUS

[76] Inventor: John H. Kettler, 1524 Centre Pointe Dr., Milpitas, Calif. 95035

[21] Appl. No.: 934,816

[22] Filed: Aug. 24, 1992

[51] Int. Cl.$^5$ .............. H01R 43/00; B23P 23/00; B21D 37/12
[52] U.S. Cl. .................. 29/564.3; 29/827; 83/165; 140/105
[58] Field of Search .............. 29/566.2, 566.3, 564.6, 29/827, 564.3, 564.5, 33 M; 140/105; 83/622, 942, 278, 279, 280, 157, 165, 112

[56] References Cited

U.S. PATENT DOCUMENTS

| | | | |
|---|---|---|---|
| 3,232,158 | 2/1966 | Breeding | 83/942 X |
| 4,409,733 | 10/1983 | Alemanni | 29/564.3 X |
| 4,885,837 | 12/1989 | Eshima et al. | 29/564 |
| 4,941,248 | 7/1990 | Seidel et al. | 29/564.6 |
| 4,945,954 | 8/1990 | Wehrly et al. | 140/105 |
| 4,957,146 | 9/1990 | Satterfield et al. | 140/105 |
| 5,070,916 | 12/1991 | Biesecker | 29/827 X |

FOREIGN PATENT DOCUMENTS

| | | | |
|---|---|---|---|
| 192710 | 11/1983 | Japan | 83/165 |
| 752840 | 8/1980 | U.S.S.R. | 29/566.3 |

*Primary Examiner*—William Briggs
*Attorney, Agent, or Firm*—Jeffrey A. Hall

[57] ABSTRACT

An automated excise-form and shuttle system and apparatus for surface mount electronic components. The apparatus comprises an electronic stepper motor which turns a lead screw to move a die shuttle mounted on a rail on the base. The shuttle has a precision lead screw nut mounted thereon which allows the shuttle to move by turning the lead screw. The shuttle rides on ball bearings which are mounted inside the shuttle with the shuttle and ball bearings moveable secured to the rail. A die shuttle utilizing a mechanical elevating and retracting cam system drives a load arm attached to a die plate to shuttle the component to a die assembly for trim and form functions. The lead screw slideably moves the excised component from a present station where a pick-up device removes the component. An automated method for excise-form function for surface mount electronic components comprising moving a surface mount electronic component to a presentation position, ejecting a carrier ring, feeding the surface mound electronic component into a die shuttle, trimming and forming leads on the surface mount electronic component, presenting the surface mount electronic component to a pick-up station, and moving the surface mount electronic component from the pick-up station by a pick up apparatus is also disclosed.

9 Claims, 3 Drawing Sheets

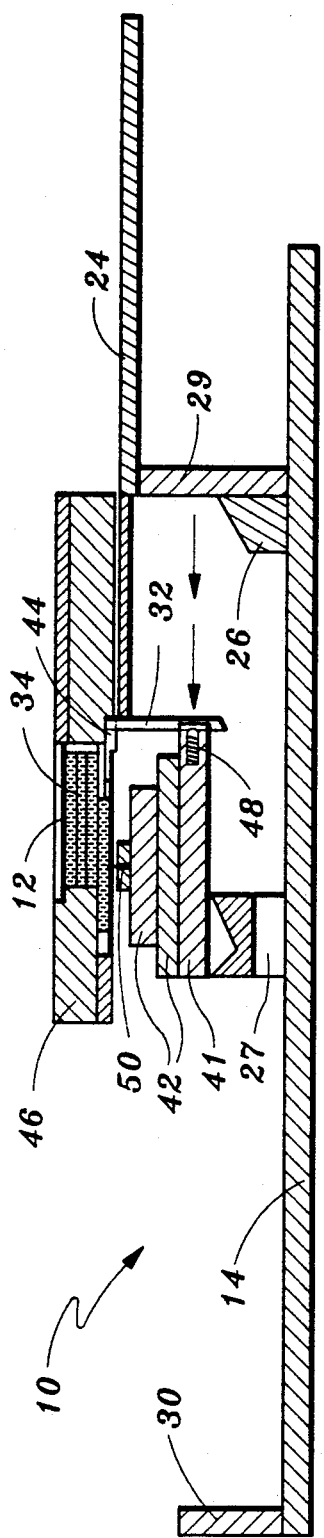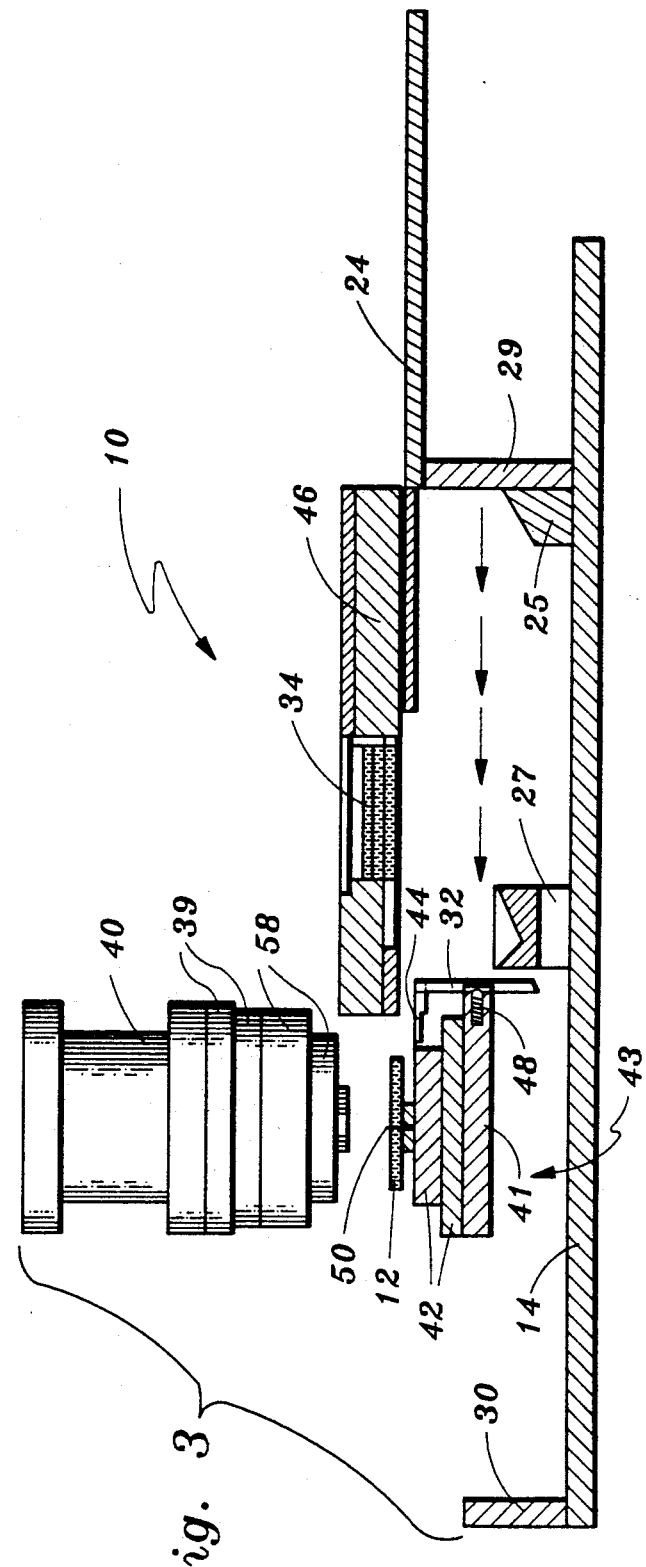

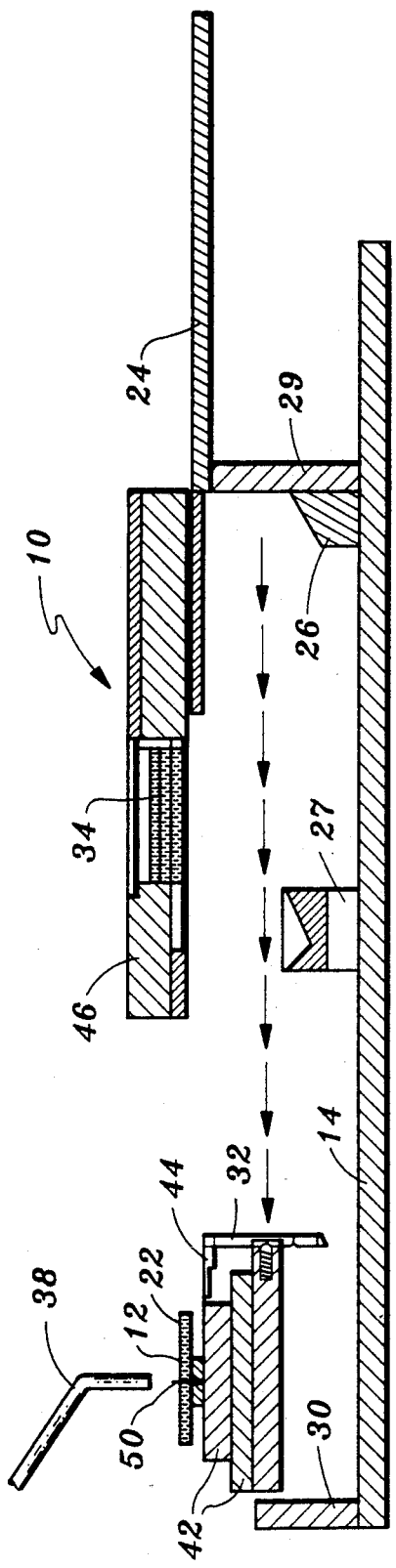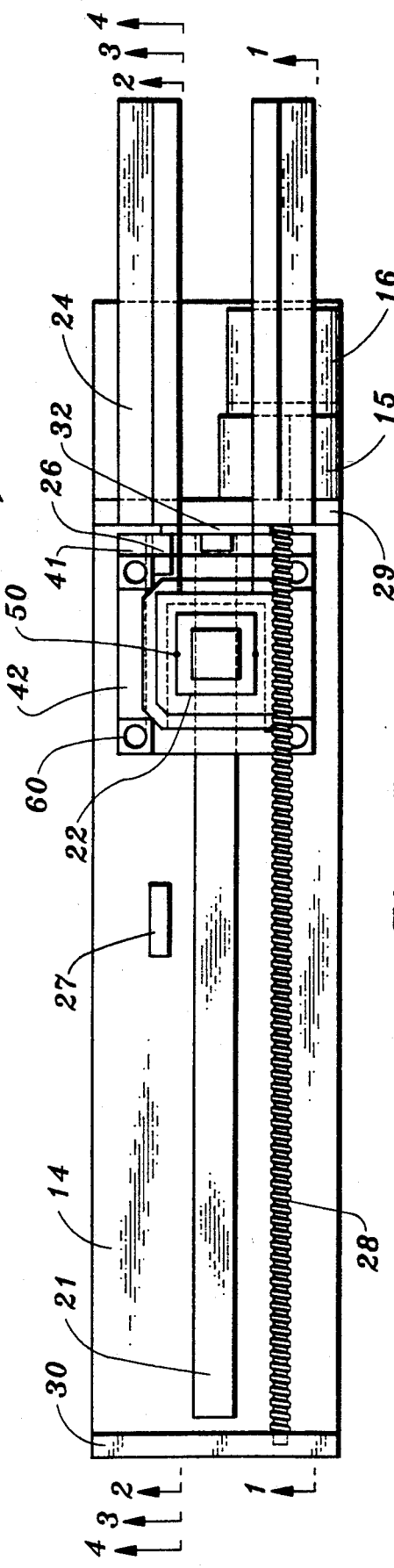

AUTOMATED EXCISE-FORM AND SHUTTLE SYSTEM AND APPARATUS

BACKGROUND OF THE INVENTION

1. Field of Invention

This invention relates to excise-form and shuttle systems, more particularly to excise-form and shuttle systems and apparatuses capable of transfer molding, trim and form feeding, and the like, used in the surface mount electronics industry.

2. Description of Prior Art

Numerous excise-form and shuttle systems have been proposed an implemented for the semiconductor industry, and in particular for the surface mount applications within the industry.

Representative examples of such apparatuses include, U.S. Pat. No. 4,885,837 issued to Eshima et al., U.S. Pat. No. 4,627,159 issued to Waldner, U.S. Pat. No. 4,516,673 issued to Kashara et al., U.S. Pat. No. 4,457,662 issued to Ireland et al., U.S. Pat. No. 4,236,306 issued to Hug et al., U.S. Pat. No. 4,232,815 issued to Nakano et al., U.S. Pat. No. 4,214,364 issued to St. Louis et al., U.S. Pat. No. 4,116,376 issued to Delorme et al., U.S. Pat. No. 3,949,925, issued to Keizer et al., U.S. Pat. No. 3,774,834 issued to Holler et al., and U.S. Pat. No. 3,488,672 issued to Martyn.

Although some similarities exist, of a general nature, between the present invention and prior devices, none provides a slide loading configuration which does not require clamping of the component part to shuttle it. None of the prior art devices known utilizes a mechanical elevating and retracting cam system which drives a load arm which is attached to a moveable die plate so as to shuttle the component part. The present invention provides a completely novel component transfer system and apparatus which allows the overall design of the shuttle system to be relatively small in relation to prior art apparatuses. The novel cam driven sliding shuttle design of the present invention further allows the transfer of components by the apparatus with a maximum of internal moving parts resulting in a more reliable, efficient, and inexpensive apparatus than any disclosed in the prior art.

SUMMARY OF THE INVENTION

The automated excise-form and shuttle system and apparatus of the present invention is designed to operate in either an automatic or manual step mode and is capable of accepting any tape automated bonding (TAB) component size from 35 mm to 70 mm. The apparatus of the present invention will also accept molded carrier ring integrated circuits, as well as most other types of carrier ringed surface mount components. The present invention includes a novel slide loading design, instead of the conventional side to side, or front to back clamping systems of the prior art. Such loading system never clamps the component part in order to shuttle it, rather, a mechanical elevating and retracting cam system is provided which drives a load arm which is attached to a moveable die plate so as to shuttle the component. This component transfer apparatus allows the overall design of the apparatus to be small and enables the transfer of components with few internal moving parts. An electronic stepper motor is preferably utilized, which turns a lead screw so as to move the apparatuses bottom shuttle. The shuttle has a precision lead screw nut mounted thereon which allows the shuttle to move by turning the lead screw. The shuttle apparatus rides on ball bearings which are mounted inside of the shuttle so that the entire shuttle and ball bearings move in a linear motion on a single hardened, precision ground steel rail.

The present invention, in one preferred embodiment, comprises a base, means for slideably moving said surface mount electronic component to a presentation position on said base and for moving said surface mount electronic component to an ejection location on said base, means of ejecting a carrier ring operably mounted on said base so that a scrap carrier ring eill slide off when said ejecting means are activated, means for feeding said surface mount electronic component into a die shuttle operably mounted onto said base, means for trimming and forming leads on said surface mount electronic component, and means for presenting and moving the surface mount electronic component to and from a trim and form station mounted on the base to a position for pick-up.

In accordance with the purposes of the invention, there is also provided an automated system for excise-form functions for surface mount electronic components, comprising: (i) moving said surface mount electronic component to a presentation position, (ii) ejecting a scrap carrier ring so that an excised component from said surface mount electronic component will be displaced from said carrier ring, (iii) feeding said surface mount electronic component into a die shuttle, (iv) trimming and forming leads on said surface mount electronic component, (v) presenting the surface mount electronic component to a pick-up station, and (vi) moving the surface mount electronic component from said pick-up station by a pick-up apparatus.

BRIEF DESCRIPTION OF THE DRAWINGS

The accompanying drawings, which are incorporated in and constitute a part of the specification, illustrate a preferred embodiment of the invention and, together with a general description given above and the detailed description of the preferred embodiment given below, serve to explain the principles of the invention.

FIG. 2 is a sectional view showing actuator arm 32 pushing out component 12 from stack loader 46, according to the invention. FIG. 3 is a sectional view showing pneumatic cylinder assembly 40 operably combined with top die plate 58 and bottom die plate 42 at trim and form station 43, according to the invention.

FIG. 4 is a sectional view of present station 36 showing excised component 12 awaiting pick-up by device 38, according to the invention.

FIG. 5 is a top view of such excise-form and shuttle apparatus, according to the invention.

DETAILED DESCRIPTION OF THE PREFERRED EMBODIMENTS

Figure 1:
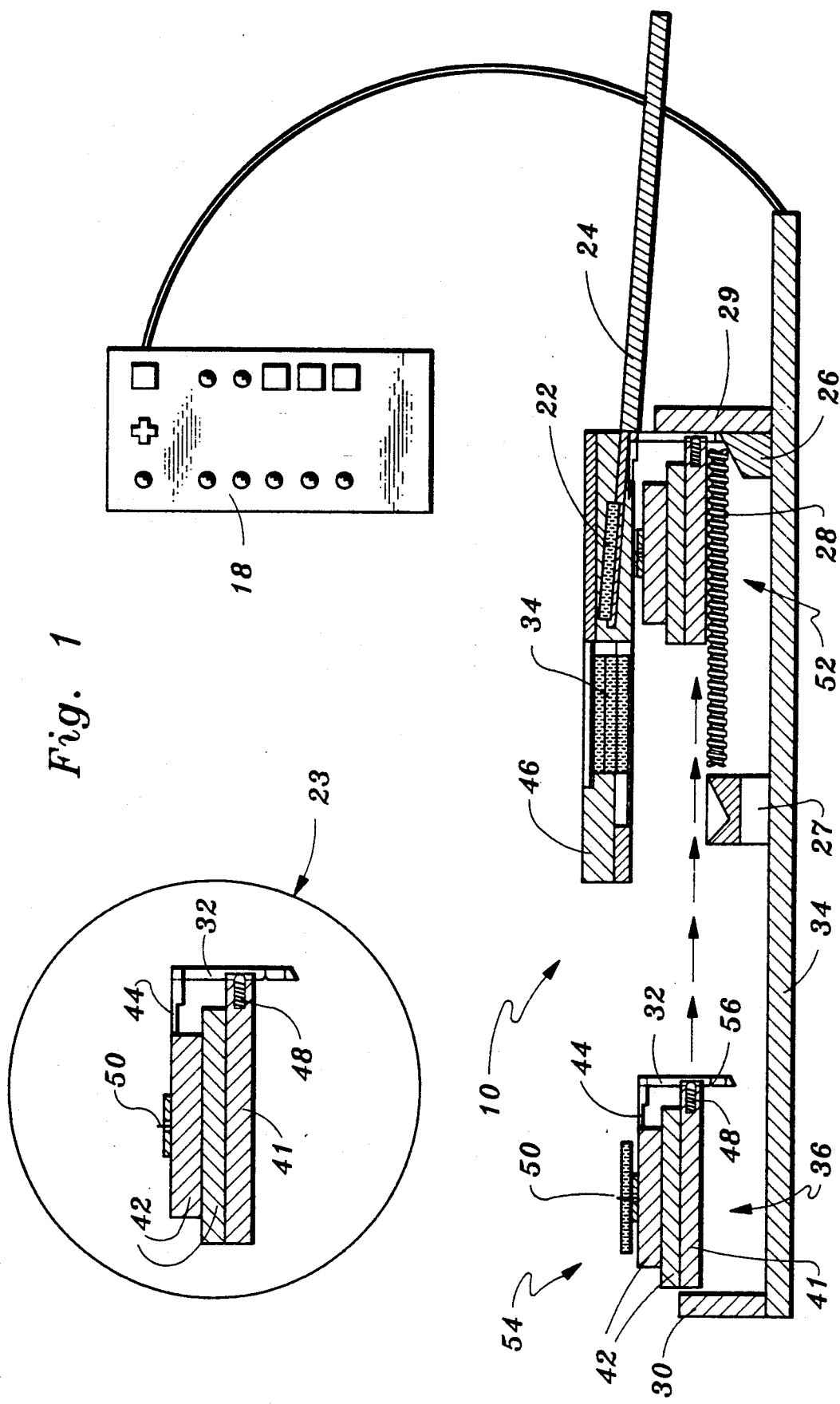
FIG. 1 is a sectional view of an embodiment incorporating the teachings of the present invention.

Reference now will be made in detail to the present preferred embodiments of the invention as illustrated in the accompanying drawings.

In accordance with the present invention, there is provided an automated excise-form and shuttle apparatus for a surface mount electronic component, comprising: a base, means for slidably moving said surface mount electronic component to a presentation position on said base and for moving said surface mount electronic component to an ejection location, means of ejecting a scrap carrier ring operably mounted on said base so that an excised component will become separated from said scrap carrier ring when said ejecting means are activated, means for feeding said surface mount electronic component into a die shuttle operably mounted onto said base, means for trimming and forming leads on said surface mount electronic component, and means for presenting and moving the surface mount electronic component to and from a trim and form station mounted on the base to a position for pick-up.

In accordance with the purposes of the invention there also is provided a system and method for excise-form functions for a surface mount electronic component, comprising: moving said surface mount electronic component to a presentation position, ejecting a carrier means so that an excised component from said surface mount electronic component will be displaced from said carrier means, feeding said surface mount electronic component into a die shuttle, trimming and forming leads on said surface mount electronic component, presenting the surface mount electronic component to a pick-up station, and moving the surface mount electronic component from said pick-up station by means of a pick-up apparatus.

In FIGS. 1 to 5, an automated excise-form and shuttle apparatus 10 for a surface mount electronic component 12 is shown with base 14, means for slideably moving said surface mounted electronic component, preferably comprising a motor 16, a hand control apparatus 18 and die shuttle 20. The die shuttle 20 is slideably moved on rail 21, riding on ball bearings within shuttle 20 and driven by lead screw 28 powered by motor 16, to a presentation position 36 and to an ejection location 52. Lead screw 28 is preferably inserted with bearing caps between front screw support 30 and back lead screw support 29, and includes a lead screw nut secured to a lead screw bracket. The lead screw bracket preferably includes screw holes for attachment of the bracket to base 14 by screws or other mechanical fastener, and a threaded hole for attaching and securing the lead screw nut of lead screw 28. Means for ejecting a carrier, preferably a scrap carrier ring 22 is operably mounted on base 14 so that an excised component will slide off scrap carrier ring 22 when ejecting means are activated. In the preferred embodiment, ejecting means are provided by carrier ejector fork 24 which is raised or lowered by linear motion in combination with retracting cam device 26 and elevating cam device 27 which are preferably a tapered slide or tapered ramp structure as best seen in FIGS. 1 and 2. Means for feeding the surface mount electronic component 12 into a die shuttle 20 are operably mounted onto base 14 and comprise, in the preferred embodiment, a load or actuator arm 32 operably linked to said die shuttle 20 so as to pick up and transport component 12 from a stack of components 34 to a die plate 42. Stack loader 46 is preferably mounted to side rails and to base 14 by screws, bolts, rivets, or the like, and preferably contains a groove clearance for sensor wires. Bottom die adaptor plate 41 is mounted to apparatus 10 by attachment to the lead screw bracket and to a bearing slide which rides on rail 21. Means for trimming and forming leads on component 12 are preferably provided by a pneumatic cylinder assembly 40, preferably a pneumatic air assembly communicatively linked to said die so as to perform of trim and form functions when activated, however, other apparatuses well known in the art may be substituted for pneumatic cylinder assembly 40. Means for presenting and moving component 12 to and from a trim and form station 43 to a pick-up position 54 are preferably provided by a lead screw 28 powered by motor 16 on rail 21. A pick-up device, such as a robotic arm 38, may be programmed to pick-up excised component 12 and move it to a desired location. As shown in FIG. 1, die shuttle 20 preferably comprises an assembly of actuator arm 32, die plate 42, drive actuator 44, ball plunger 48, and locating pins 50 as described.

The system provided by the present invention comprises, in one preferred embodiment, and described as a cyclic process, moving surface mount electronic component 12 to presentation position 36, preferably slideably moving component 12 by a motor 16 in housing 15 which is controlled by control apparatus 18, and moving component 12 on die shuttle 20 on rail 21 by lead screw 28 coupled to motor 16 by conventional means well known in the art. In a cyclic description, the following step is ejecting a carrier, preferably carrier ring 22 by ejector fork 24 operably raised by mechanical cam 26, allowing scrap carrier 22 to slide off of die plate 42. Feeding component 12 onto die shuttle 20, which preferably has a load arm 32 operably linked to die shuttle 20 so as to pick uo and transport component 12 from a stack of such components 34 to a die plate 42. Trimming and forming, or excising of component 12 is preferably accomplished by pneumatic cylinder assembly 40 operably linked to die plate 42. Presenting component 12 to pick-up station 54 by motor driven lead screw 28 on rail 21, where pick-up device 38, such as a robotic arm or other mechanical or manual device removes component 12 from apparatus 10.

More particularly, in a preferred system and assembly, the excise and shuttle cycle starts when power is turned on through hand held controller 18 operably linked to motor 16 and to power means such as an electric outlet. The die shuttle 20 then moves from present station 36 toward ejector fork 24 on rail 21. Once die shuttle 20 is close to ejector fork 24 mechanical cam 26 moves load arm 32 into its upper feed position, and raises eject fork 24 up at the same time. This upward movement of fork 24 allows an excised component to slide off the shuttle. After the shuttle 20 reaches the furthermost position to the back of apparatus 10, the shuttle changes direction and begins to move forward with load arm 32 elevated in a feed position. Preferably, a coin stack method of accessing components is used, with coin stack 34 placed between eject station 52 and trim and form or excise station 43. While shuttle 20 moves forward, load arm 32 passes underneath coin stack 34 and slides one component 12 out of the stack. As shuttle 20 continues forward, component 12 slides onto die plate 42. Die shuttle 20 continues to move forward on rail 21 while cam 26 retracts load arm 32. After retraction of load arm 32, shuttle 20 moves into position for excise or trim and form operation, and pauses. Pneumatic cylinder assembly 40 on top of the die drives the top portion of the die down until the die has bottomed out. After this downward movement, assembly 40 retracts and the top die plate goes back into position. Once this cycle is completed, component 12 is completely excised and formed and is positioned on the shuttle. The shuttle then moves forward towards present station 36 where shuttle 20 stops and awaits another cycle to initiate.

In FIG. 1 the bottom of die shuttle 20 is shown riding on rail 21 and driven by lead screw 28 which is powered by motor 16 and controlled, preferably by hand held electronically controlled apparatus 18. Lead screw 28 ejects excised carrier ring 22 following excise-form operations on component 12. Ejector fork 24 is lifted, by linear movement at substantially the bottom of die shuttle 20, along with actuator arm 32 which contacts elevating cam device 26. Ejector fork 24 is preferably hingedly secured to apparatus 10 by a hinge mounted by screws, bolts, or other mechanical fasteners well known in the art. Actuator or load arm 32 is preferably secured to a drive actuator assembly 44 and to elevating cam device 26 having a vee slot 56 thereon. Elevating cam device 26 is preferably a tapered slide or elevating ramp, and once the linear motion is completed the elevating motion is completed as well. Elevating cam device 26 preferably includes dowel holes for securing dowels therein for alignment and threaded holes for securing screws or other mechanical fasteners therein to attachment of elevating cam device 26 to base 14. In the elevated position, a ball plunger 48 which is preferably spring powered, engages in vee slot 56 which locks arm 32 in an extended position.

As shown in FIG. 2, by reversing lead screw 28 directional motion, the bottom of die shuttle 20 travels forward on rail 21 where actuator arm 32 pushes out carrier 22 and component 12 from stack loader 46. Stack loader 46 is preferably secured to apparatus 10 by screws, rivets, or other mechanical fasteners well known in the art, as is the bottom die adapter plate 41, actuator arm 32, pneumatic cylinder assembly 40, motor housing 15 housing motor 16, and the back lead screw support 29 and front lead screw support 30. Back lead screw support 29 is secured to base 14 and to motor 16 by screws, bolts, rivets, or other mechanical fasteners. Front lead screw support 30 preferably includes dowel holes for alignment and threaded holes for mechanical fasteners, such as screws, or bolts, for mounting support 30 to base 14.

Carrier 22 and component 12 are slid from stack 34, as shown in FIG. 3, and is lowered onto locating pins 50 on bottom of die shuttle 20. Lead screw 28 continues to move die shuttle 20, carrier 22, and component 12 to excise or trim and form station 42 and actuator arm 32 is pulled out of the extended locked vee position to a lower or retracted position by retracting cam device 27. Retracting cam device 27 preferably includes a dowel hole for alignment, and threaded holes for screws to secure retracting cam device 27 to base 14. Once the bottom of die 20 has reached station 42 lead screw 28 is programmed to pause allowing component 12 to be excised and formed.

After excise or trim and form functions have been performed at station 43, lead screw 28 engages allowing die shuttle 20 to travel forward on rail 21 to present station 36. When die shuttle 20 reaches present station 36 the excise-form or trim and form cycle has been completed and component 12 awaits pick-up by pick-up device 38 which may be a robotic arm or other mechanical device. Once component 12 has been removed a signal from control apparatus 18 signals apparatus 10 to begin a new cycle.

Referring now to FIG. 5, a top view of apparatus 10 is shown with die shuttle 20 and carrier 12 in an ejection stage, where bottom of die adapter plate 42 is guided by rail 21 and driven by lead screw 28. Holes 60 for aligning the bottom die to the upper die, lead screw 28 with front support 30 and back support 29, elevating cam device 26, retracting cam device 27, actuator arm 32, bottom die adapter plate 41, and motor 16 in motor housing 15, are operably secured to base 14.

In operation and use excise-form and shuttle apparatus 10 performs excise or trim and form functions on a wide variety of surface mount electronic components including molded carrier ring integrated circuits. Apparatus 10 provides such functions by its unique slide loading configuration utilizing rail 21, lead screw 28, and die shuttle 20 so that apparatus 10 never clamps component 12 in order to shuttle it, rather, cam 25 in combination with retracting cam device 27 and elevating cam device 26, provide a mechanical elevating and retracting system. Die shuttle 20 rides on rail 21, and drives lead screw 28 to eject carrier 22. The ejection apparatus, as described, is lifted by linear movement at the bottom of die shuttle 20 with die plate 42 and bottom die adapter plate 41 with arm 32 contacting elevating cam device 26. Once the linear motion is completed, the elevating motion is completed as well. In this position, spring powered ball plunger 48 is engaged in a precision vee slot 56 locking arm 32 in an extended position. Next, the bottom of die shuttle 20 on rail 21 driven by lead screw 28, travels forward to slide out another carrier 22 and component 12 toward the present station 36. Once the new carrier has been slid from the carrier stack, carrier 22 and component 12 are lowered precisely on to locating pins 50 on die shuttle 20. As lead screw 28 moves bottom of die shuttle 20, carrier 22, and component 12 to trim and from station 42, the actuator arm 32 is pulled out of an extended locked vee position to a lowered or retracked position by retracting cam device 27, allowing carrier 22 and component 12 to be trimmed and formed by pneumatic cylinder assembly 40 operably coupled to upper die 58 by top die clamp 39. The cycle continues with die shuttle 20, carrier 22, and component 12, riding rail 21 and driven by lead screw 28 to present station 36 where a robotic arm or pick-up device 38 removes component 12. When component 12 is removed a signal is sent from control apparatus 18 and the cycle starts again.

While the above description contains many specificities, they should not be construed as limitations on the scope of the invention, but merely as exemplifications of preferred embodiments thereof. Additional advantages and modifications will readily occur to those skilled in the art. The invention in its broader aspects is, therefore not limited in the specific details, representative apparatus and system in the examples shown and described. Accordingly, departures may be made from such details without departing from the spirit or scope of the applicant's general inventive concept, and the scope of the invention determined by the appended claims and their legal equivalents.

I claim:

1. An automated excise-form and a die shuttle apparatus for a surface mount electronic component, comprising:

a base, means for slideably moving said surface mount electronic component to a presentation position on said base and for moving a surface mount scrap carrier ring to an ejection location comprising a motor powered hand controlled die shuttle, said die shuttle being slideably moveable on a rail and driven by a lead screw, means for ejecting a carrier operably mounted on said base so that a scrap carrier ring will slide off of said die shuttle when said ejecting means are activated, means for feeding said surface mount electronic component into a die shuttle operably mounted onto said base, means for trimming and forming leads on said surface mount electronic component including means for excising the carrier ring, and means for presenting and moving the surface mount electronic component to and from a trim and form station mounted on the base to a position for pick-up.

2. The automated excise-form and shuttle apparatus of claim 1 wherein said means for ejecting said scrap carrier ring comprises an ejection fork operably raised and lowered by a mechanical cam allowing said scrap carrier ring to be ejected from said die shuttle.

3. The automated excise-form and shuttle apparatus of claim 1 wherein said means for feeding said surface mount electronic component into said die shuttle comprises a load arm operably linked to said die shuttle so as to pick up and transport said surface mount electronic component from a stack of components to a die plate.

4. The automated excise-form and shuttle apparatus of claim 1 wherein said means for presenting and moving said surface mount electronic component comprises said lead screw slideably moving said excised component to a present station having a pick-up apparatus for removing the excised component from said present station.

5. An automated method for excise-form functions for a surface mount electronic component, comprising:

(i) moving said surface mount electronic component to a presentation position by a motor powered, hand held electronically controlled die shuttle, said die shuttle moves on a rail and is driven by a lead screw, (ii) ejecting an excised carrier ring from said die shuttle so that the carrier ring slides off the die shuttle, (iii) feeding said surface mount electronic component into said die shuttle, (iv) trimming and forming leads on said surface mount electronic component and then excising the carrier ring, (v) presenting the surface mount electronic component to a pick-up station, and (vi) moving the surface mount electronic component from said pick-up station by a pick-up apparatus.

6. The automated method for excise-form functions for a surface mount electronic component of claim 5 wherein step (ii) comprises ejecting a scrap carrier ring by an ejection fork operably raised and lowered by a mechanical cam allowing said scrap carrier ring to slide off said die shuttle.

7. The automated method for excise-form functions for a surface mount electronic component of claim 5 wherein step (iii) comprises feeding said surface mount electronic component into a die shuttle having a load arm operably linked to the die shuttle so as to pick-up and transport said surface mount electronic component from a stack of such components to a die plate.

8. The automated method for excise-form functions for a surface mount electronic component of claim 5 wherein step (iv) comprises trimming and forming leads on said surface mount electronic component by a pneumatic cylinder assembly operably linked to a die plate.

9. The automated method for excise-form functions for a surface mount electronic component of claim 5 wherein step (v) comprises presenting said surface mount electronic component to a pick-up station by a motor driven lead screw moving said component on a rail to said pick-up station.

* * * * *